United States Patent [19]
Sato

[11] Patent Number: 5,457,402
[45] Date of Patent: Oct. 10, 1995

[54] ARMATURE RESISTANCE MEASURING APPARATUS AND METHOD

[75] Inventor: Akira Sato, Hadano, Japan

[73] Assignee: Odawara Engineering Co., Ltd., Kanagawa, Japan

[21] Appl. No.: 232,503

[22] Filed: Apr. 25, 1994

[51] Int. Cl.$^6$ .................................................. G01R 27/14
[52] U.S. Cl. .......................... 324/772; 324/713; 324/704; 324/546; 324/715; 324/545
[58] Field of Search .................................... 324/713, 704, 324/546, 715, 545, 772

[56] References Cited

U.S. PATENT DOCUMENTS

| | | | |
|---|---|---|---|
| 2,463,567 | 3/1949 | Samstag | 324/715 |
| 4,053,830 | 10/1977 | Porter | 324/545 |
| 4,651,086 | 3/1987 | Domenichini et al. | 324/546 |
| 5,140,276 | 7/1992 | Fisher | 324/713 |
| 5,307,019 | 4/1994 | Robey | 324/713 |

Primary Examiner—Kenneth A. Wieder
Assistant Examiner—Mark Wardas
Attorney, Agent, or Firm—Thompson, Hine and Flory

[57] ABSTRACT

A method and apparatus for determining the resistance of the coils and commutator connections in an armature of an electric motor wherein a current is generated between a first commutator segment and a commutator segment located at least three segments beyond said first segment, a first voltage is measured across the first commutator segment and an adjacent second commutator segment, a second voltage is measured across the second commutator segment and an adjacent third commutator segment, and a third voltage is measured across a pair of commutator segments which are adjacent to the first commutator segment. After the three voltages are measured, the current is disconnected, and a voltage is generated across two commutator segments spaced at least three segments beyond the first segment. The generated voltage is adjusted so that the voltage measured across the second and third commutator segments equals the previous measurement, and the voltages are remeasured. With the voltages measured across the second and third commutator segments being equal, the connection and coil resistances for the first commutator segment are calculated from the voltage measurements and the value of the generated current. The armature is then indexed, and the measurements repeated, to determine the coil and connection resistance of subsequent segments.

17 Claims, 1 Drawing Sheet

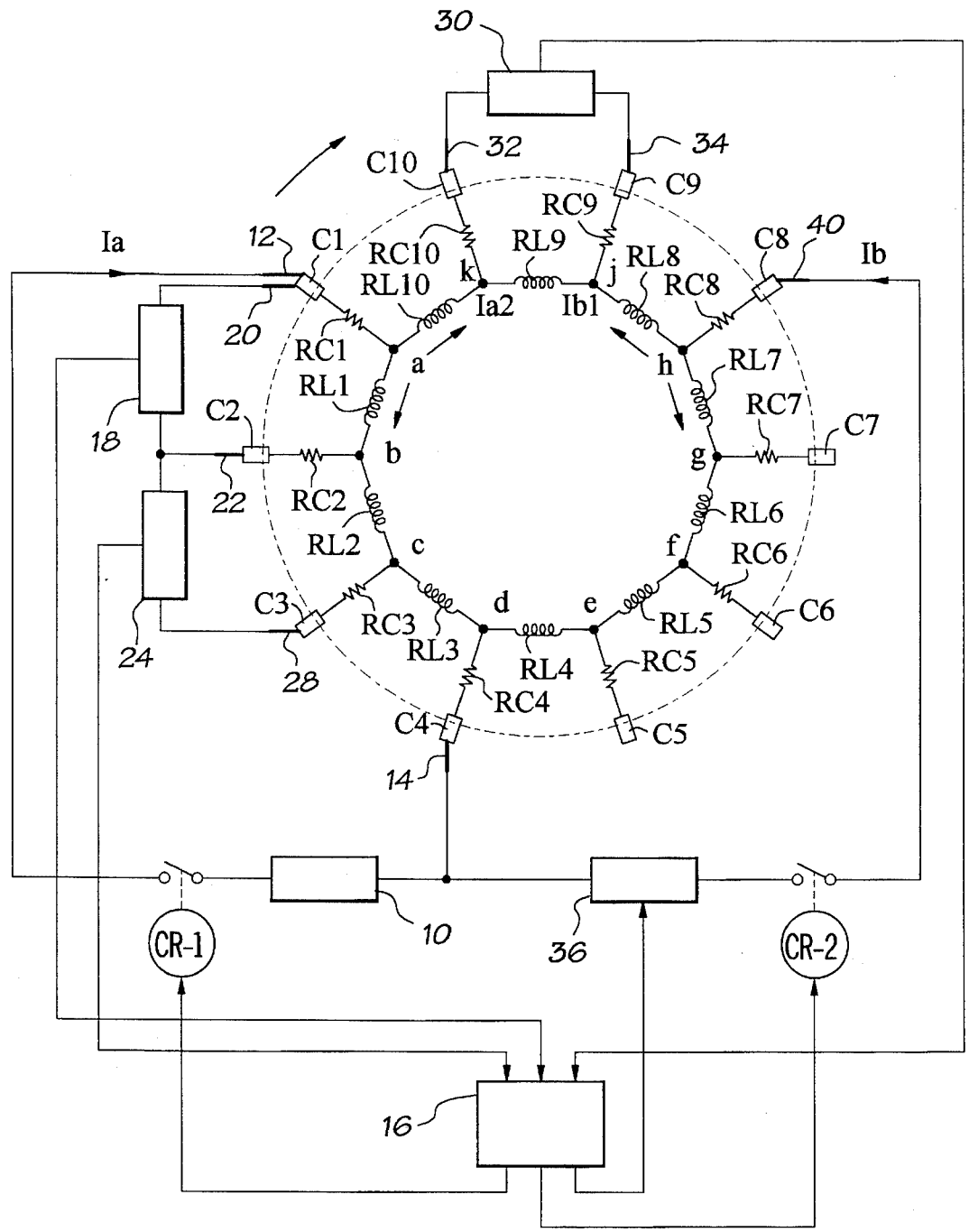

ARMATURE RESISTANCE MEASURING APPARATUS AND METHOD

BACKGROUND OF THE INVENTION

This invention is related to electrical testing equipment and, more particularly, to an apparatus and method for independently measuring the resistance of a wound coil, and the resistance of the connection between the wound coil and a commutator segment on an armature of an electric motor.

With a commutator motor, it is desirable to test the wound coil resistance, and the connection resistance between the wound coils and commutator segments on the armature to assure that the armature is correctly wound, and to detect any wire breakage, short circuits or other faults.

When the coils are wound on the armature, part of each coil is looped around a small hook raised at an angle from the commutator, in order to connect the coil to the commutator segment. Spot welding or fusing is applied to the coil and hook in order to connect the coil and hook to the commutator. The welding or fusing process also burns the insulation coating off of the coil to obtain a close connection between the coil and commutator, thereby enabling a free flow of current.

If the spot welding or fusing is poorly performed, the hooks bent to the commutator segments may be forced to open outwardly by the centrifugal forces developed when the armature revolves at a high speed inside of the stator. If the hooks open, the coil wires may become loose from the commutator and disrupt the operation of the motor. Therefore, to avoid loose coil wires and the attendant problems, it is important to assure that each coil is correctly and securely fused to the commutator after the armature is fully wound and assembled. The fused connections can be tested by measuring the connection resistance between the wound coils and commutator segments. If the measured resistance exceeds a tolerance range, it is an indication that the connection may be faulty. In addition, the resistance of each wound coil can be measured, independently of the connection resistance, in order to verify that the coil is correctly wound.

In the past, it has been difficult to precisely measure the resistance of a single fused connection without cutting the winding, since the wound coils share a common connection with the commutator segments. Further, the connection resistance between the coils and commutator segments is typically small, on the order of 1% to 3% of the coil resistance. Therefore, measuring the voltage across a pair of commutator segments to which the tangs of one coil are connected can miss faulty fused connections, since the resistance produced by a faulty connection may be too small to fall outside the tolerance range for the coil resistance. Therefore, to detect connection faults it is desirable to measure the connection resistance directly, independent of the wound coil resistance.

Accordingly, there is a need for an apparatus and method for accurately measuring the connection resistance between a wound coil and a commutator segment on the armature of an electric motor, and for measuring the resistance of the wound coil independent of the connection resistance.

SUMMARY OF THE INVENTION

It is an object of the present invention to provide a method and apparatus for independently measuring the resistance of a wound coil and a commutator connection on an armature of a commutator-type electric motor. The resistance measurements are made through electrical connections applied to the commutator segments, which are easily accessible, and provide information about the correctness of the armature winding, its continuity, and whether the electrical connections of the coils are defective.

The method and apparatus of the present invention is applicable to an armature having a plurality of coils connected in series, with each of the coils being fused to a pair of tangs on adjacent commutator segments. The invention includes generating a current between a first commutator segment and a commutator segment located at least three segments beyond the first segment. With the current flowing, a first voltage is measured across the first commutator segment and a second commutator segment adjacent to the first segment, a second voltage is measured across the second commutator segment and a third commutator segment adjacent to the second segment, and a third voltage is measured across a pair of commutator segments that are adjacent to the first commutator segment, on the side opposite the second commutator segment.

After the three voltages are measured, the current is disconnected, and a voltage generator is connected across two commutator segments which are spaced at least three segments below the first segment, to generate a second current through the winding. The generator voltage is adjusted until the voltage measured across the second and third commutator segments equals the voltage previously measured across these segments. With the voltage across the second and third commutator segments equal to the prior reading, the voltage is again measured across the first and second commutator segments, and across the pair of commutator segments adjacent to the first segment.

Since the voltage generator is adjusted so that the voltage measurements across the second and third commutator segments are equal, the current through the associated coil is the same for both measurements. Using this equality, the connection resistance for the first commutator segment is calculated from the voltage measurements across the first and second commutator segments and the value of the generated current. Further, using the voltages measured across the commutator segments adjacent to the first segment, the resistance of the first wound coil is calculated independent of the connection resistance. The armature is then indexed, and the measurements repeated, to determine the connection and wound coil resistances for the remaining commutator segments.

Accordingly, it is an object of the present invention to provide a method for measuring the resistance of a fused connection on an armature winding independent of the coil resistance without the need to cut the winding; a method for measuring coil resistance independent of any connection resistance; and an apparatus and method in which both the connection resistance and coil resistance for a commutator segment can be measured with the apparatus in a single position, without the need to rotate the apparatus or armature.

Other objects and advantages of the present invention will be apparent from the following description, the accompanying drawing and the appended claims.

BRIEF DESCRIPTION OF THE DRAWING

The drawing is a schematic of the present invention connected to an armature of an electric motor.

DETAILED DESCRIPTION

As shown in the drawing, the apparatus and method of the present invention is described in conjunction with an armature winding comprised of ten coils a-b, b-c, c-d, d-e, e-f, f-g, g-h, h-j, j-k, and k-a, which are connected to ten commutator segments C1, C2, C3, C4, C5, C6, C7, C8, C9, and C10. The present invention, however, can be used to test the armature of an electric motor having any number of coils and commutator segments greater than seven.

The armature winding shown in the drawing is made up of the series connection of the ten coils a-b through k-a. The juncture between each of the coils is connected to a commutator segment, such that each coil is connected to the commutator at opposite ends. Thus, coil a-b is connected at opposite ends to commutator segments C1 and C2, coil b-c is connected at opposite ends to commutator segments C2 and C3, coil c-d is connected to commutator segments C3 and C4, coil d-e is connected to commutator segments C4 and C5, coil e-f is connected to commutator segments C5 and C6, coil f-g is connected to commutator segments C6 and C7, coil g-h is connected to commutator segments C7 and C8, coil h-j is connected to commutator segments C8 and C9, coil j-k is connected to commutator segments C9 and C10, and coil k-a is connected to commutator segments C10 and C1.

The connection between each of the coils and its respective commutator segment exhibits a resistance which is to be measured by the apparatus and method of the present invention. This resistance is indicated schematically in the drawing as Rc1, Rc2, Rc3, Rc4, Rc5, Rc6, Rc7, Rc8, Rc9, and Rc10. Further, each coil exhibits a resistance which is indicated in the drawing as RL1, RL2, RL3, RL4, RL5, RL6, RL7, RL8, RL9 and RL10.

To measure the resistance of the first coil a-b and the first commutator connection a-C1, a constant current supply 10 is applied to the winding by a pair of electrical contacts 12, 14, which are connected to commutator segments C1 and C4. Commutator segment C4 is spaced three segments from C1. As shown in the drawing, the current supply 10 is attached so that a current flows into the winding through segment C1. The current supply 10 is applied to the winding through an electrical relay CR-1. Relay CR-1 enables the current from the supply 10 to be connected or disconnected from the winding. The relay CR-1 is also connected to an electrical control 16. A voltmeter 18 is connected across commutator segments C1 and C2 by electrical contacts 20 and 22. A second voltmeter 24 is connected across commutator segments C2 and C3 by electrical contacts 22 and 28, and a third voltmeter 30 is connected across commutator segments C9 and C10 by electrical contacts 32 and 34.

A voltage generator 36 is connected across commutator segments C4 and C8 by electrical contacts 14 and 40, to produce a voltage across the segments and a current in the winding. As shown in the drawing, the voltage generator 36 is connected so that a current Ib flows into the winding through commutator segment C8. The voltage generator 36 is connected to segment C8 through an electrical relay CR-2. Relay CR-2 enables current from the voltage generator 36 to be connected or disconnected from the winding. The control 16 is connected to the voltage generator 36 and to each of the voltmeters 18, 24, and 30.

With the electrical components attached to the armature, the relay CR-1 is turned on by the control 16. Turning relay CR-1 on allows a current Ia to flow from the supply 10 to the first commutator segment Cl, through the fused connection, and into the winding. Current Ia divides at juncture a in the winding into two current portions Ia1 and Ia2. The portion Ia1 flows through coils a-b, b-c, and c-d, while the portion Ia2 flows through coils k-a, j-k, h-j, g-h, f-g, e-f and d-e.

When current Ia flows through the coil connection between windings a-b and k-a, it generates a voltage which is equal to the value of the current Ia times the resistance of the commutator connection Rc1. A voltage is also produced across the coil a-b. This voltage is the product of the current portion Ia1 and the winding resistance RL1. The sum of the voltages across the commutator connection and the coil a-b is measured by voltmeter 18 through the contacts 20, 22. For purposes of description, this voltage is identified as Va1. The current portion Ia1 also flows through the winding coil b-c, and generates a voltage which is equal to the value of the coil resistance RL2 times the current value Ia1. This voltage is measured by voltmeter 24, and identified as Vb1. The current portion Ia2 flows through the winding coil j-k and generates a voltage which is the product of the coil resistance RL9 and the current Ia2. This voltage is measured by the voltmeter 30, and identified as Vc1. Each of the measured voltages Va1, Vb1, and Vc1 are input to the control 16.

After the voltages Va1, Vb1 and Vc1 have been measured and input to the control 16, the relay CR-1 is turned off and the relay CR-2 turned on through the control 16 to connect the voltage generator 36 to the winding. The voltage generator 36 produces a current Ib that flows into the winding through the commutator segment C8. The current Ib divides into two portions Ib1 and Ib2 at juncture h in the winding. As shown in the drawing, the portion Ib1 flows through the coils h-j, j-k, k-a, a-b, b-c and c-d. The second portion Ib2 flows through the coils g-h, f-g, e-f and d-e. With current Ib1 flowing through the winding b-c, the voltage drop across the winding b-c is again measured with the voltmeter 24. This voltage is the product of the current Ib1 and the coil resistance RL2, and is identified as Vb2. If Vb2 differs from the voltage Vb1 previously measured across coil b-c with the current Ia1 flowing, the voltage generator 36 is adjusted through the control 16 until the voltage Vb2 equals Vb1. Once the voltage measured across coil b-c equals Vb1, the voltage across segments C1 and C2 is measured again with voltmeter 18 and identified as Va2. Voltage Va2 is the product of current Ib1 and the coil resistance RL1. The voltage across segments C9 and C10 is also measured again with voltmeter 30. This voltage is the product of current Ib1 and the coil resistance RL9, and is identified as Vc2. Each of the measured voltages Va2 and Vc2 are input to the control 16.

Adjusting the voltage generator so that the voltage drop across coil b-c is the same value with the voltage generator 36 as with the current supply 10 produces the equality Ia1=Ib1. With this equality established, the resistance Rc1 of the connection between coils a-b, k-a and the commutator segment C1 can be determined from the following equations:

$$Va1 = Ia \times Rc1 + Ia1 \times RL, \text{ and}$$

$$Va2 = Ib1 \times RL.$$

Since Ia1=Ib1; the above equations simplify to:

$$Ia \times Rc1 = Va1 - Va, \text{ or}$$

$$Rc1 = (Va1 - Va2)/Ia.$$

Using the equality Ia1=Ib1, and the measured voltages Va2, Vc1, and Vc2, the resistance RL1 of the coil a-b is determined independently of the commutator connection by the following equations:

$$Vc1 = Ia2 \times RL,$$

$$Vc2 = Ib1 \times RL,$$

$$Ia = Ia1 + Ia2$$

Since Ia1=Ib1, substituting into the above equations produces:

$Ia1 = Ia \times Vc2/(Vc1+Vc2)$ and $RL1 = Va2/Ia1$

Therefore, $RL1 = Va2/[Ia \times Vc2/(Vc1+Vc2)]$, or $RL1 = Va2 \times (Vc1+Vc2)/Ia \times Vc$.

After the first coil and commutator connection resistances are determined from the above calculations, the armature is indexed by one commutator segment, and the steps repeated to determine the connection and coil resistance for the next commutator segment.

In the present invention, both the coil and fused connection resistance for a commutator segment can be determined with the armature and apparatus in a single position, without the need to index the armature and obtain additional measurements for the segment. For each position of the armature, the resistance of the coil and the commutator connection can be obtained by measuring three voltages Va1, Vb1 and Vc1 with a current supply applied to the winding, and three voltages Va2, Vb2 and Vc2 with a voltage generator applied to the windings. With these six voltage measurements, and the value of the current from the current supply, the connection and coil resistances are independently calculated. Additionally, the armature need only be indexed one position for each additional segment to be measured on the armature.

While the method and apparatus herein described constitutes a preferred embodiment of the invention, it is to be understood that the invention is not limited to these precise forms, and that changes may be made therein without departing from the scope of the invention.

What is claimed is:

1. A method of measuring the resistance of a commutator connection in an armature of a type having a plurality of coils connected in series, each of said coils being electrically connected to the commutator by a commutator connection, said method comprising the steps of:

generating a current through a first commutator connection and any commutator connection spaced at least three commutator connections from said first connection;

measuring a first voltage across said first connection and a second commutator connection adjacent said first connection;

measuring a second voltage across said second connection and a third commutator connection adjacent to said second connection;

disconnecting said current, and applying a voltage across any two commutator connections other than said first, second, or third connections, and spaced at least three connections from said first connection;

adjusting said applied voltage so that voltage between said second and third connections equals said second voltage;

measuring a third voltage across said first and second connections; and determining a resistance for said first connection from said current and said voltages, said resistance being independent of associated coil resistance.

2. The method of claim 1 wherein said method also measures the resistance of a wound coil, and includes the steps of measuring a fourth voltage between fourth and fifth commutator connections adjacent said first commutator connection with said current, and measuring a fifth voltage between said fourth and fifth connections with said applied voltage, and determining a resistance of a wound coil associated with said first commutator connection from said current and said voltages.

3. The method of claim 1, wherein said steps are repeated for other commutator connections on said armature to determine additional connection resistances.

4. A method of measuring commutator connection resistance and wound coil resistance in an armature of a type having a plurality of coils connected in series, each of said coils being electrically connected to the commutator by a commutator connection, said method comprising the steps of:

generating a current between a first commutator connection and any commutator connection spaced at least three connections from said first connection;

measuring a first voltage between said first connection and a second commutator connection adjacent said first connection;

measuring a second voltage between said second connection and a third commutator connection adjacent to said second connection;

measuring a third voltage between fourth and fifth commutator connections adjacent said first connection;

disconnecting said current, and applying a voltage between any two commutator connections other than said first, second or third connections, and spaced at least three connections from said first connection;

adjusting said applied voltage so that a voltage between said second and third connections equals said second voltage;

measuring a fourth voltage between said first and second connections;

measuring a fifth voltage between said fourth and fifth connections; and determining resistance for said first commutator connection and an associated coil from said current and said voltages, whereby said connection resistance is determined independently of coil resistance.

5. The method of claim 4 wherein said steps are repeated for other commutator connections on said armature to measure additional connection and coil resistances.

6. The method of claim 5 wherein said step of generating a current includes connecting a current source and a relay across said commutator connections, said current being generated when said relay is on.

7. The method of claim 6 wherein said step of generating a voltage includes connecting a voltage generator and a relay across said commutator connections, said voltage being applied when said relay is on.

8. The method of claim 7 wherein said armature includes at least seven coils.

9. A method of measuring commutator connection resistance in an armature of a type having a plurality of coils connected in series, each of said coils being electrically connected to the commutator by a commutator connection, said method comprising the steps of:

generating a first current between a first commutator connection and any commutator connection spaced at least three commutator connections from said first connection;

measuring a first voltage between said first connection and a second commutator connection adjacent said first connection;

measuring a second voltage between said second connection and a third commutator connection adjacent to said second connection;

measuring a third voltage between fourth and fifth commutator connections adjacent said first connection;

disconnecting said first current, and generating a second current between any two commutator connections other than said first, second or third connections, and spaced at least three connections from said first connection;

adjusting said second current until a voltage across said second and third commutator connections equals said second voltage measurement;

measuring a fourth voltage between said first and second commutator connections;

measuring a fifth voltage between said fourth and fifth commutator connections; and determining resistance of said first connection and an associated coil from said currents and said voltages, whereby said connection resistance is determined independently of said coil.

10. An apparatus for determining a commutator connection resistance in an armature of a type having a plurality of coils connected in series, each of said coils being electrically connected between a pair of commutator connections, said apparatus comprising:

means for generating a current between a first commutator connection and any commutator connection at least three connections beyond said first commutator connection;

means for measuring a first voltage between said first commutator connection and a second commutator connection adjacent said first commutator connection;

means for measuring a second voltage between said second commutator connection and a third commutator connection adjacent to said second commutator connection;

means for disconnecting said current;

means for applying a voltage between any two of said commutator connections other than said first, second or third connections, and spaced at least three connections from said first commutator connection;

means for adjusting said applied voltage so that a voltage between said second and third connections equals said second measured voltage;

means for measuring a third voltage between said first and second commutator connections; and means for determining a resistance of said first commutator connection from said current and said voltages, said connection resistance being independent of any associated coil resistance.

11. The apparatus of claim 10 further comprising means for indexing said armature relative to said apparatus for determining each connection resistance in said armature.

12. The apparatus of claim 11 further comprising means for measuring an associated coil resistance including: means for measuring a fourth voltage across fourth and fifth commutator connections adjacent said first commutator connection with said current; means for measuring a fifth voltage across said fourth and fifth commutator connections with said applied voltage; and means for determining a resistance of a first coil from said current and said voltages.

13. An apparatus for determining coil and commutator connection resistances in an armature of a type having a plurality of coils connected in series, each of said coils being electrically connected between a pair of commutator connections, said apparatus comprising:

means for generating a current between a first commutator connection and any commutator connection spaced at least three commutator connections from said first commutator connection;

means for measuring a first voltage between said first commutator connection and a second commutator connection adjacent to said first commutator connection;

means for measuring a second voltage between said second commutator connection and a third commutator connection adjacent to said second commutator connection;

means for measuring a third voltage between fourth and fifth commutator connections adjacent to said first commutator connection;

means for disconnecting said current, and applying a voltage between any two commutator connections other than said first, second or third connections and spaced at least three connections from said first commutator connection;

means for adjusting said applied voltage so that a voltage between said second and third connections equals said second voltage;

means for measuring a fourth voltage between said first and second commutator connections;

means for measuring a fifth voltage between said fourth and fifth commutator connections; and means for determining a connection resistance between said commutator and a coil, and a resistance of said coil from said current and said measured voltages.

14. The method of claim 9 wherein said first commutator connection resistance is Rc1, wherein said first current is Ia, wherein said first measured voltage is Va1, wherein said fourth measured voltage is Va2, and wherein said connection resistance is determined by equation:

$$Rc1=(Va1-Va2)/Ia.$$

15. The method of claim 14 wherein said associated coil resistance is RL1, wherein said third measured voltage is Vc1, wherein said fifth measured voltage is Vc2, and wherein said associated coil resistance is determined by equation:

$$RL1=Va2\times(Vc1+Vc2)/Ia\times Vc.$$

16. The apparatus of claim 13 wherein said first commutator connection resistance is Rc1, wherein said first current is Ia, wherein said first measured voltage is Va1, wherein said fourth measured voltage is Va2, and wherein said connection resistance is determined by equation:

$$Rc1=(Va1-Va2)/Ia.$$

17. The apparatus of claim 16 wherein said associated coil resistance is RL1, wherein said third measured voltage is Vc1, wherein said fifth measured voltage is Vc2, and wherein said associated coil resistance is determined by equation:

$$RL1=Va2\times(Vc1+Vc2)/Ia\times Vc.$$

* * * * *

UNITED STATES PATENT AND TRADEMARK OFFICE
CERTIFICATE OF CORRECTION

PATENT NO. : 5,457,402
DATED : Oct. 10, 1995
INVENTOR(S) : Sato

It is certified that error appears in the above-identified patent and that said Letters Patent is hereby corrected as shown below:

Column 8, Line 50 (claim 15), "RL1 = Va2 x (Vc1 + Vc2)/Ia x Vc" should read, --RL1 = Va2 x (Vc1 + Vc2)/Ia x Vc2--.

Column 8, Line 65 (claim 17), "RL1 = Va2 x (vc1 +Vc2)/Ia x Vc" should read, -- RL1 = Va2 x (Vc1 + Vc2)/Ia x Vc2--.

Signed and Sealed this

Thirtieth Day of January, 1996

Attest:

BRUCE LEHMAN

*Attesting Officer*     *Commissioner of Patents and Trademarks*